United States Patent [19]

Brown

[11] Patent Number: 4,513,307

[45] Date of Patent: Apr. 23, 1985

[54] CMOS/SOS TRANSISTOR GATE ARRAY APPARATUS

[75] Inventor: James L. Brown, Toddville, Iowa

[73] Assignee: Rockwell International Corporation, El Segundo, Calif.

[21] Appl. No.: 375,059

[22] Filed: May 5, 1982

[51] Int. Cl.³ .................... H01L 27/12; H01L 27/10; H01L 29/78
[52] U.S. Cl. ...................................... 357/42; 357/41; 357/45; 357/23.7
[58] Field of Search ................ 357/23 TF, 45, 41, 42

[56] References Cited

U.S. PATENT DOCUMENTS

| | | | |
|---|---|---|---|
| 3,999,214 | 12/1976 | Cass | 357/45 |
| 4,278,897 | 7/1981 | Ohno et al. | 357/45 |
| 4,295,149 | 10/1981 | Balyoz et al. | 357/45 |
| 4,356,504 | 10/1982 | Tozun | 357/42 |
| 4,412,237 | 10/1983 | Matsumura et al. | 357/45 |

OTHER PUBLICATIONS

Suskind et al., "The CMOS/SOS Automated Universal Array", *Proceedings of the* 1981 *Custom Integrated Circuits Conference*, pp. 69–72, (IEEE).

*Primary Examiner*—William D. Larkins
*Assistant Examiner*—Charles S. Small, Jr.
*Attorney, Agent, or Firm*—Bruce C. Lutz; George A. Montanye; H. F. Hamann

[57] ABSTRACT

A universal gate array is illustrated using a specific pattern of CMOS (Complementary Metal Oxide Silicon) Transistors in an array which provides a high degree of board utilization in the layout of small runs of integrated circuits where the high cost of completely customized boards is unacceptable. The array comprises a continuing pattern of two sets of three (3) series connected transistors in a cell surrounded on all four sides by cells each containing two single transistor gates of each channel type.

10 Claims, 3 Drawing Figures

CMOS/SOS TRANSISTOR GATE ARRAY APPARATUS

INVENTION

The present invention is generally related to electronics and more specifically related to integrated circuits. Even more specifically, the invention is related to CMOS/SOS (Complementary Metal Oxide Silicon/Silicon on Sapphire) universal gate array configurations for efficient utilization of land area of said array on an integrated circuit chip.

The prior art has realized that for small runs of integrated circuits (IC's), it is not economically feasible to design a new integrated circuit layout for each application. Thus, the prior art has included arrays of single transistors where each transistor had to be individually connected to other transistors through the use of later attached, etched or applied leads. It was soon realized, by those working in the art, that there were enough instances where a multiplicity of transistors needed to be connected together that such an array was not efficient in terms of all the space required for the later defined interconnect leads. Thus, arrays have been produced having sets of two transistors connected together or in some instances three transistors connected together. This arrangement produced an array of either two or three transistors configured across the desired surface of the integrated circuit chip. It has been found, however, that there are enough instances where a single transistor still needs to be connected to another unit that the examples above do not provide efficient utilization of the land area of the chip. If only a single transistor is used in a normal series connection, one of the three transistors in the set is used and the other two are unused. One manufacturer introduced the concept of having a row of three transistors in a set and then the next row having two transistors in a set. The following row again has three transistors. This again increased the utilization of the IC land area as compared to those instances previously mentioned.

The present invention provides a significant advance as compared with the above ideas and realizes that there are still more efficient array designs especially in the area of interconnection. As described later in more detail, a set of three transistors of P channel type are connected together and a set of three N channel transistors connected together to form a cell. Two individual transistors of each channel type form a second and different cell. The second cells may be interconnected to the first cells in each of four directions since each column and row comprises alternate land area sets of transistors (cells) of the configuration of three transistor sets connected together and two individual transistor sets. In some circuit types, the increase in utilization of land area of the integrated circuit chip is as much as fifty percent over the next best gate array configuration.

It is therefore, an object of the present invention to provide an improved array of transistors in terms of economy of materials, economy of size, speed of operation, and/or time required to design the total connected circuit.

These, and other objects of the invention, will become apparent from a reading of the specification and appended claims in conjunction with drawings wherein:

DETAILED DESCRIPTION

Figure 1:
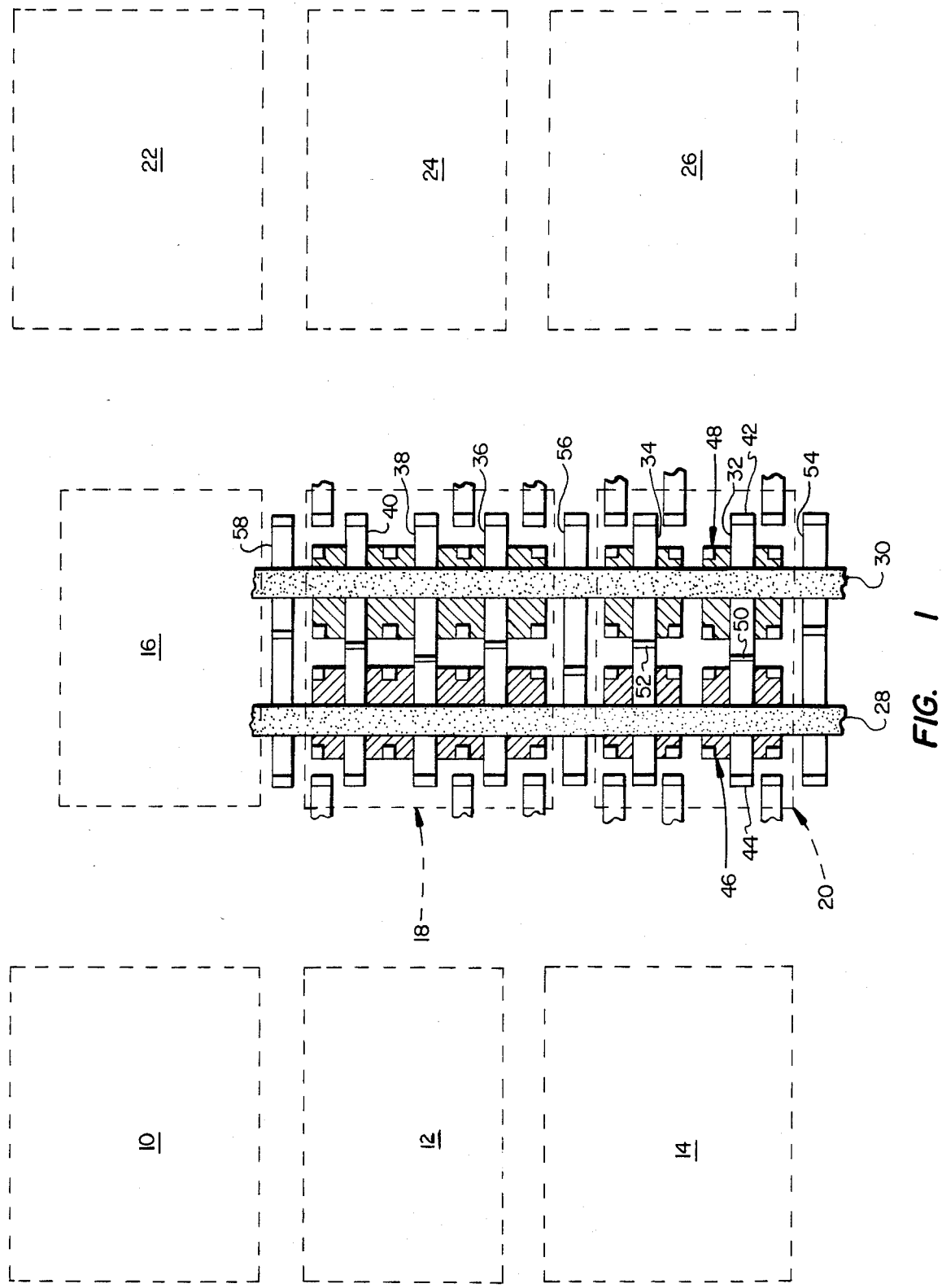
FIG. 1 is a block diagram illustrating details of the gate array for two adjacent blocks.

In FIG. 1, nine dash line blocks represents nine cells of gates in an array. A complete array however, would typically be much larger than nine cells. The cells are labeled 10 through 26 as illustrated. By definition in this specification a "cell" defines an area containing one of two predefined transistor arrays. Details are provided for cells 18 and 20 only. Cell 18 has three N channel transistors connected contiguously and also three P channel transistors. The cells 10, 14, 22, and 26 also have three transistors of each channel type as shown in cell 18. On the other hand, cell 20 has two independent N type transistors and two independent P type transistors. The contents of cell 20 are identical to the contents of cells 12, 16 and 24.

In the figure, a pair of vertical metal strips, conductors or contacts 28 and 30 provide power at a voltage of +5 volts and ground, respectively to the individual transistors as required. Also illustrated are a plurality of gate leads 32, 34, 36, 38 and 40. In each case these leads extend from left to right over a pair of transistor islands. Each of these leads are terminated with a contact area such as contact area 42 on the right-hand side of gate lead 32 and contact area 44 on the left-hand side of gate lead 32. Intermediate, the two transistor islands 46 and 48 is a further contact area 50. Gate lead 34 has a further contact area 52 in a position similar to that of contact area 50, except that it is staggered in space with respect to contact area 50. As will be noted, the contact areas on the gate leads are staggered between the columns of transistors. Finally, there are further contact leads, conductors, or strips illustrated, such as 54, 56 and 58, which are situated between the cells of transistors. These various leads or conductive areas, such as 32 through 40, are comprised of polysilicon material for conductivity, and are not directly related to the transistor material. Leads 54 through 58 comprise conductive areas that may have the same base material as the highly doped drain, source, or may be polysilicon material.

Figure 2:
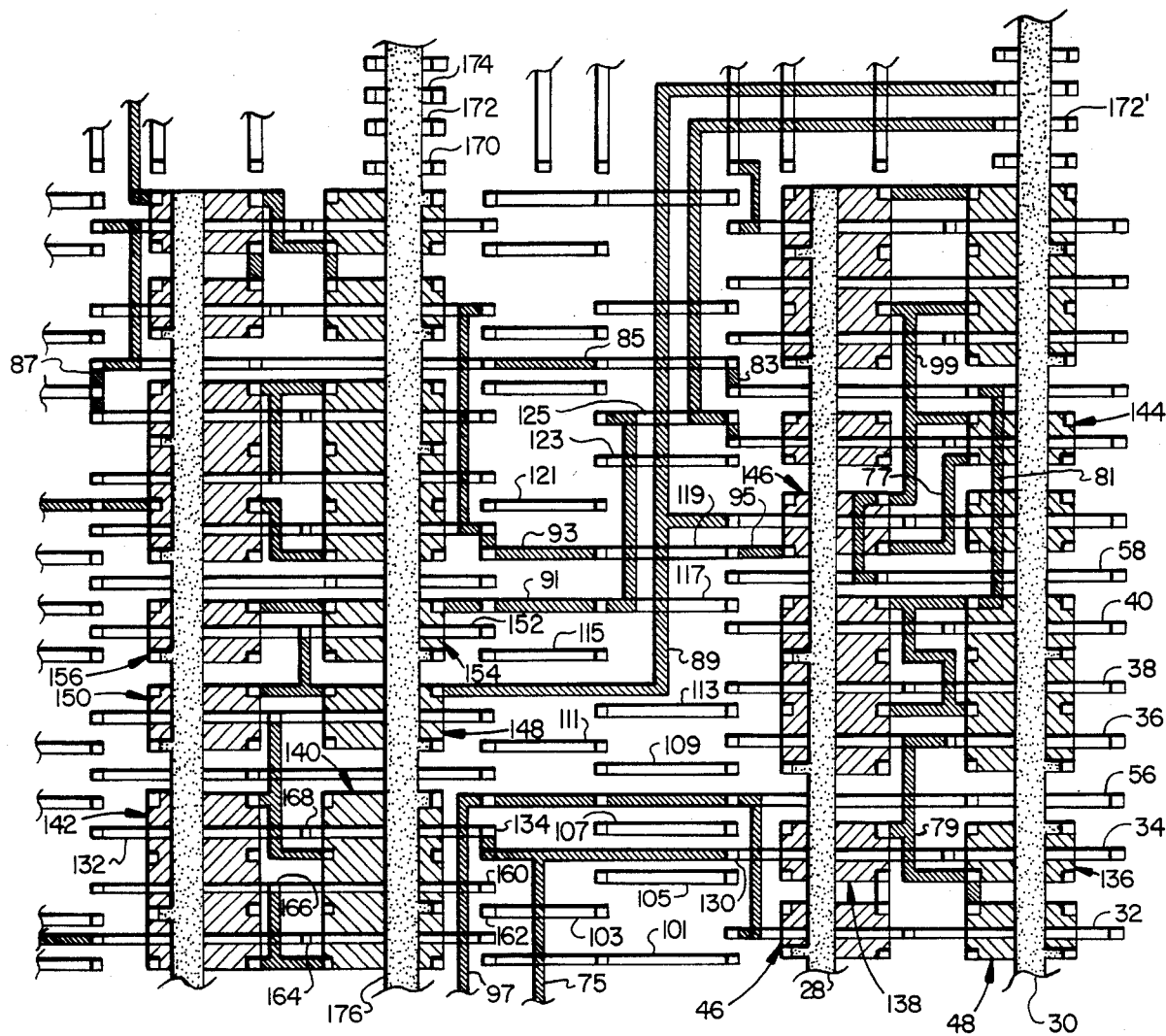
FIG. 2 is a detailed illustration of several sets of blocks with interconnect patterns illustrated.

In FIG. 2, the same numbers as were used in FIG. 1 are used where appropriate. In addition, it will be noted that there is a plurality of crosshatched leads such as 75, 77, 79, 81, 83, 85, 87, 89, 91, 93, 95, 97, and 99. Also more clearly illustrated are leads 101, 103, 105, 107, 109, 111, 113, 115, 117, 119, 121, 123, and 125. It will be noted that some of the leads, such as incoming lead 75, are crosshatched and other leads such as 111 and 113 are not crosshatched. (The crosshatched portions of the material illustrated as leads are defined at a time subsequent to the initial production of the chip to customize the chip to a particular circuit configuration. As the chip is initially produced, the entire surface of the chip is covered with a metal such as aluminum. The majority of the aluminum is then etched away to produce the leads defining specific circuitry. These leads are shown in a multiplicity of places in FIG. 2. Leads 75, 97 and 89 are examples of these later defined leads.) While the bus leads such as 28 and 30 are also produced from this surface aluminum, the placement of these leads is, of course, known. However, the extensions going to the contacts such as shown in various places in FIG. 2 are not defined until the time of customization. Since these bus leads are unique in being partly defined and partly undefined, they have been illustrated as dotted material. While not particularily important to the inventive concept, the chip is then covered with an insulating material such as silox in all areas except those areas where leads from external sources need to be connected to contact areas on the chip.) It should also be noted that lead 75 is connected not only to the gate lead 34 via contact area 130, but also connected to gate lead 132 via contact area 134. Thus, signals are supplied to transistors 136, 138, 140, and 142. Other leads such as 89 are also connected to more than one transistor. As illustrated, lead 89 is connected to the gate lead of transistors 144 and 146, as well as to the drain contact pad of transistor 148. Transistor 148 has a drain contact connected to a similar drain contact of a transistor 150 as well as being connected to a gate lead 152 which is common to transistors 154 and 156.

As mentioned briefly in conjunction with FIG. 1, most of the sets of contact areas such as 134, 160, 162, etc. are in vertical columns. However, the contact areas on the gate leads, in the areas between the transistors such as contact areas 164, 166, and 168 alternate from side to side in the vertical space between the transistors. As will be noted, there are a plurality of tunnel, dive under, or crossunder leads such as 170, 172, 172' and 174 providing connections from one side of ground lead 176 to the other. Similar crossunders are found on the right-hand side of FIG. 2 for crossing under the ground lead 30.

The island conductors or tunnel leads such as 170 through 174 are provided to allow opportunities for crossing the later defined or customizing leads. In other words, one or two leads could be run parallel with the ground lead in the area between the contacted portions of each of the leads 170, 172 and 174. Thus, there could be in effect a crossing of signal paths without interfering electrical contact there between. While it is realized that there are other vertical leads as defined in the initial production of the universal device and as shown at the top of FIG. 2, the inventor believes that the further horizontal leads are required for the additional flexibility provided thereby.

Figure 3:
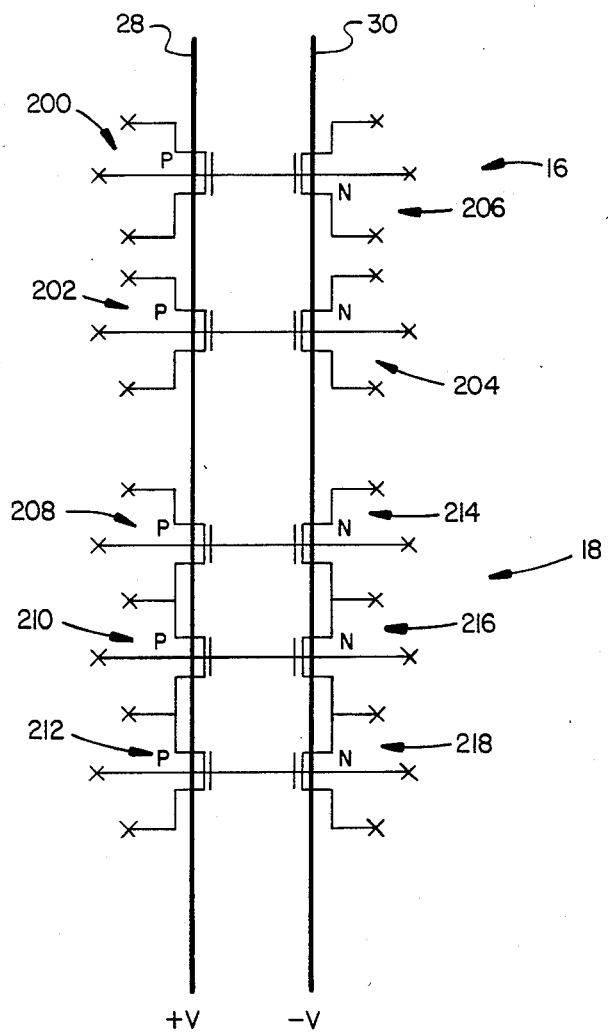
FIG. 3 is a circuit diagram of the sets of transistors shown in detail in blocks 18 and 20 of FIG. 1.

In FIG. 3, the designators 16 and 18 are used to illustrate corresponding cells between the sets of transistors in FIG. 3 and in FIG. 1. In addition, designators from 200 to 218 are utilized to differentiate the different transistors in FIG. 3. The transistors 200, 202 and 208 through 212 are P channel transistors corresponding to the transistors which may be connected to the positive power lead such as 28 in FIG. 1. The remaining transistors may be connected to the ground lead such as 30 in FIG. 1. As will be realized, the transistors 200 through 206 are not illustrated in the cell 16 of FIG. 1.

OPERATION

As previously indicated, the purpose and incentive behind the present invention was to design a universal array of transistors on an integrated circuit chip which chip could be easily and economically customized to define specific circuits while maximizing land area usage on the chip. In other words, the present invention evolved from an attempt to originate a universal configuration which over a large variety of circuits will provide the most efficient and compact design. Thus, the design is an attempt to have the smallest number of unusable transistors in the array after customization. The majority of the integrated circuit chip is manufactured at one time and provides a standard format upon which to define specific interconnect circuitry. Thus, the remaining manufacturing of the chip can follow a few standardized procedures to provide customized circuitry.

As will be observed from an examination of FIG. 1 in conjunction with FIG. 2, the basic or universal process provides a format with sets of three transistors of the P channel type connected in series immediately adjacent three series connected N channel transistors to form an area defined as a cell. On each of four sides of the cell containing the pair of series connected transistors are other cells containing 4 individual transistors. As an example, in cell 20 there are two independent P channel transistors and two independent N channel transistors. The N and P transistors have a common gate lead.

The layout illustrated in FIG. 1 is used as the basis for customizing circuit design. In other words, the universal array of FIG. 1 is modified by the addition or definition of the various crosshatched leads of FIG. 2 to interconnect the various transistors to form flip-flops, gates, etc. (It will be remembered that previous reference was made to the fact that although the bus bars 28 and 30 of FIG. 1 are known items, they are not actually defined from the aluminum covering until the bus bar interconnections to specific transistors can be defined simultaneously.) FIG. 2 specifically uses the lead 89 to provide input signals to the various transistors 144, 146, 148, 150, 154 and 156. The transistors 144 and 146 form a part of a transmission gate and the transistors 148, 150, 154 and 156 form inverters. As will be noted, the standardized leads such as 109, 111 and 113 do not extend the entire distance from one cell to the next cell. The reason for this is to minimize coupling when there are leads parallel to the universal leads and also to provide further space for customizing leads. This is illustrated specifically by lead 75 which goes between standard leads 105 and 107. If leads 105 and 107 extended across the space between the three transistor cells on the left and the individual transistor cell on the right, there would be considerable additional coupling. If it is desirable to use the standardized strip, a connection can be made from the contact points such as is illustrated by added leads 85 and 93. The crossunders 170, 172 and 174 are provided to allow further crossing of the bus lines with respect to signal paths without becoming shorted one to another. The crossunders 170, 172 and 174 allow lower signal series resistance in crossing signals under power buses than using a crossunder such as 58 or unused gate lead such as 36. As an example, conductor 89 is connected to crossunder 172' rather than use the gate lead of transistor 146 and the gate lead of the adjoining transistor to crossunder bus 30. It is also desirable to have the contacts such as 134 and 160 spaced from the transistor cells by enough distance to allow at least one customized lead to be situated between the contacts and the transistors of the cell. This is illustrated by lead 97 which not only uses this space relative to the transistors on the left-hand cell of the FIG. 2, but also with respect to the right-hand cell containing transistor 46.

It is further desirable to provide connections between the N and P channel transistors. As shown, the connection points or contacts of the various gate leads are situated in an alternating sequence to provide maximum flexibility in customizing connections.

In summary, the present invention is a universal array having cells of three series connected transistors of each channel type adjacent on all four sides to cells of two independent transistors of each channel type. Additional features of the inventive concept comprise the spacing and placement of standardized connections between cells and having contact points in alternating sequence between transistors of a cell wherein each of these last two features faciliate the customizing connection of the terminals of the transistors to form customized circuit interconnections with minimal numbers of unusable transistors.

It will be realized by those skilled in the art that I wish to be limited not by the specifics of the layout illustrated, but only by the scope of the appended claims, wherein I claim:

1. An integrated circuit transistor gate array comprising, in combination:
   a substrate;
   an array of groups of transistor gates, each transistor gate comprising a source, a drain and a control lead, fabricated on the substrate wherein each group comprises three contiguous transistor gates of a first polarity type connected in a drain-source series arrangement, two isolated transistor gates of said first polarity type, three contiguous transistor gates of a second polarity type connected in a drain-source series arrangement, and two isolated transistor gates of said second polarity type;
   first means, attached to said substrate, connecting the control lead of each transistor gate of said first polarity to a control lead of a corresponding transistor gate of the second polarity in the group; and
   insulation means covering a portion of said first means between said control leads whereby further leads can be attached to said substrate to interconnect noncontiguous transistor gates separated by said first means.

2. An integrated circuit FET transistor array comprising, in combination:
   a substrate having a plane surface with X and Y dimensions;
   first groups of FET transistors, each transistor in a group including source, drain and gate means, fabricated on the substrate wherein each group comprises three contiguous transistors of a first polarity connected in a drain-source series arrangement and three contiguous transistors of a second polarity connected in a drain-source series arrangement; and
   second groups of FET transistors, each transistor in a group including source, drain and gate means, fabricated on the substrate between said first groups of FET transistors, said second group comprising two isolated transistors of a first polarity and two isolated transistors of a second polarity, said array comprising alternating first and second groups of transistors in both the X and Y directions on the surface of said substrate.

3. A transistor array comprising, in combination:
   substrate means;
   first and second columns of CMOS/SOS transistors on said substrate means, each transistor in each of said columns including gate lead means and gate contact means extending on said substrate means in an outwardly direction from said column means wherein at least a portion of said gate lead means is insulated;
   interconnect means situated on said substrate means for providing electrical connections between transistors in different columns, said interconnect means comprising interconnect contact means and interconnect insulated portions, the insulated portions of said gate lead means and said interconnect means being adapted to having further leads attached to said substrate means and passing over said insulated portions, said gate contact means and said interconnect contact being interleaved to form further columns juxtaposed said columns of transistors; and
   said transistors in said columns are grouped to have a repeating arrangement of three pairs of series connected complementary transistors and two pairs of independent complementary transistors both in said columns of transistors and across said columns of transistors.

4. A universal array of transistors manufactured with provisions for later definition of specific circuits incorporating transistors in said array comprising, in combination:
   a plurality of first cells of transistors each of said first cells including,
      three series connected P channel type transistors,
      three series connected N channel type transistors, and
      common gate leads interconnecting similarly situated ones of said P channel type and N channel type transistors, said common gate leads having contact areas between connected transistors, said contact areas alternating in proximity to given channel type transistors; and
   a plurality of second cells of transistors each of said second cells including,
      two independent P channel type transistors,
      two independent N channel type transistors, and
      common gate leads interconnecting similarly situated ones of said P channel type and N channel type transistors, said common gate leads having contact areas between connected transistors, said contact areas alternating in proximity to given channel type transistors.

5. A universal array of transistors manufactured with provisions for later definition of specific circuits incorporating transistors in said array comprising, in combination:
   a plurality of first cells of transistors each of said first cells including,
      three series connected P channel type transistors,
      three series connected N channel type transistors, and
      common gate leads interconnecting similarly situated ones of said P channel type and N channel type transistors, said common gate leads having contact areas between connected transistors, said contact areas alternating in proximity to given channel type transistors;
   a plurality of second cells of transistors each of said second cells including,
      two independent P channel type transistors,
      two independent N channel type transistors, and
      common gate leads interconnecting similarly situated ones of said P channel type and N channel type transistors, said common gate leads having contact areas between connected transistors, said contact areas alternating in proximity to given channel type transistors;
   first interconnect leads, including first, second and third contact areas, situated near the end of given cells within columns between sets of second interconnect leads in the same column as said first interconnect leads having first and second contact areas which are aligned columnarly with said first and second contact areas of said first interconnect leads; and third interconnect leads situated in the same columns as said first and second interconnect leads, said third interconnect leads including two contact areas aligned columnarly with said second and third contact areas of said first interconnect leads, said second and third interconnect leads being substantially one-half the length of said first interconnect leads and said second interconnect leads being closer to one side of said column and said third interconnect leads being closer to the other side of said column.

6. Apparatus as claimed in claim 5 comprising, in addition end contacts on said common gate leads of said plurality of cells of transistors being columnarly aligned with said contact areas of said interconnect means on opposite sides of columns defining said plurality of first cells of transistors.

7. Apparatus as claimed in claim 6 wherein said end contacts are positioned a distance away from the transistors in said cells sufficient to permit later defining of conductive paths between said end contacts and the body of the transistor.

8. An integrated circuit transistor gate array comprising, in combination:
a substrate;
an array of groups of transistor gates, each transistor gate comprising a source, a drain and a control lead, fabricated on the substrate wherein each group comprises three contiguous transistor gates of a first polarity type connected in a drain-source series arrangement, two isolated transistor gates of said first polarity type, three contiguous transistor gates of a second polarity type connected in a drain-source series arrangement, and two isolated transistor gates of said second polarity type;
first means, attached to said substrate, connecting the control lead of each transistor gate of said first polarity type to a control lead of a corresponding transistor gate of the second polarity type in the group; and
insulation means covering a portion of said first means between said control leads whereby further leads can be attached to said substrate to interconnect noncontiguous transistor gates separated by said first means.

9. An integrated circuit FET transistor array comprising, in combination:
a substrate having a plane surface with X and Y dimensions;
first groups of FET transistors, each transistor in a group including source, drain and gate means, fabricated on the substrate wherein each group comprises three contiguous transistors of a first polarity type connected in a drain-source series arrangement and three contiguous transistors of a second polarity type connected in a drain-source series arrangement; and
second groups of FET transistors, each transistor in a group including source, drain and gate means, fabricated on the substrate between said first groups of FET transistors, said second group comprising two isolated transistors of a first polarity type and two isolated transistors of a second polarity type, said array comprising alternating first and second groups of transistors in both the X and Y directions on the surface of said substrate.

10. A transistor array comprising, in combination:
substrate means;
first and second columns of transistors on said substrate means, each transistor in each of said columns including gate lead means and gate contact means extending on said substrate means in an outwardly direction from said column means wherein at least a portion of said gate lead means is insulated;
interconnect means situated on said substrate means for providing electrical connections between transistors in different columns, said interconnect means comprising interconnect contact means and interconnect insulated portions, the insulated portions of said gate lead means and said interconnect means being adapted to having further leads attached to said substrate means and passing over said insulated portions, said gate contact means and said interconnect contact being interleaved to form further columns juxtaposed said columns of transistors; and
said transistors in said columns are CMOS/SOS and are grouped to have a repeating arrangement of three pairs of series connected complementary transistors and two pairs of independent complementary transistors both in said columns of transistors and in rows across said columns of transistors.

* * * * *